United States Patent
Li (10) Patent No.: US 10,811,513 B2
(45) Date of Patent: Oct. 20, 2020

(54) VERTICAL TUNNELING FIELD EFFECT TRANSISTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/559,891

(22) Filed: Sep. 4, 2019

(65) Prior Publication Data
US 2019/0393323 A1    Dec. 26, 2019

Related U.S. Application Data

(63) Continuation of application No. 15/974,426, filed on May 8, 2018, now Pat. No. 10,446,660.

(30) Foreign Application Priority Data

May 9, 2017  (CN) .......................... 2017 1 0323454

(51) Int. Cl.
*H01L 29/66* (2006.01)
*G11C 11/412* (2006.01)
*H01L 29/423* (2006.01)
*H01L 21/762* (2006.01)
*H01L 29/78* (2006.01)
*H01L 29/40* (2006.01)
*B82Y 10/00* (2011.01)
(Continued)

(52) U.S. Cl.
CPC ........ *H01L 29/66356* (2013.01); *B82Y 10/00* (2013.01); *G11C 11/412* (2013.01); *H01L 21/762* (2013.01); *H01L 29/0676* (2013.01); *H01L 29/401* (2013.01); *H01L 29/4232* (2013.01); *H01L 29/42376* (2013.01); *H01L 29/66439* (2013.01); *H01L 29/66545* (2013.01); *H01L 29/7827* (2013.01); *H01L 29/775* (2013.01)

(58) Field of Classification Search
CPC ........... H01L 29/66666; H01L 29/7827; H01L 21/823487; H01L 29/66545
See application file for complete search history.

(56) References Cited

U.S. PATENT DOCUMENTS

2017/0222045 A1* 8/2017 Leobandung ....... H01L 29/0847
2017/0309723 A1* 10/2017 Ando ................ H01L 21/28255

* cited by examiner

*Primary Examiner* — Thomas L Dickey
(74) *Attorney, Agent, or Firm* — Anova Law Group, PLLC (57) ABSTRACT

A vertical tunneling field effect transistor is provided and includes: a semiconductor substrate; a first doped layer on the semiconductor substrate; vertical nanowires on the first doped layer; a second doped layer on a top of each vertical nanowire; an interlayer dielectric layer on the first doped layer, including a cavity between the adjacent vertical nanowires through the interlayer dielectric layer and exposing sidewalls of the adjacent vertical nanowires; a high-K gate dielectric layer in sidewalls and a bottom of each cavity; and a gate electrode layer on the high-K gate dielectric layer to fill each cavity.

19 Claims, 8 Drawing Sheets

(51) Int. Cl.
*H01L 29/06* (2006.01)
*H01L 29/775* (2006.01)

VERTICAL TUNNELING FIELD EFFECT TRANSISTOR DEVICE

CROSS-REFERENCES TO RELATED APPLICATION

This application is a continuation application of U.S. patent application Ser. No. 15/974,426, filed on May 8, 2018, which claims the priority of Chinese Patent Application No. 201710323454.6, filed on May 9, 2017, the content of all of which is incorporated by reference in their entirety.

TECHNICAL FIELD

The present disclosure generally relates to the field of semiconductor technologies and, more particularly, relates to a vertical tunneling field effect transistor (VTFET) device

BACKGROUND

As critical dimensions of complementary metal-oxide-semiconductor (CMOS) transistors continuously decrease, total powers consumed by the CMOS transistors continuously increase, because short channel effects (e.g., an increased leakage current) becomes more and more serious. Supply voltages cannot continuously decrease as the critical dimensions of the CMOS transistors decrease. A subthreshold swing of the typical CMOS transistor has a limited value of about 60 mV/decade, and a certain amount of change in the voltage becomes necessary to change the CMOS transistors from an off state to an on state. Correspondingly, typical CMOS transistors have a minimum supply voltage.

Compared to the CMOS transistors, a tunneling field effect transistor (TFET) has a subthreshold swing smaller than 60 mV/decade. Correspondingly, the TFET has a smaller working voltage and a smaller leakage current. The TFET gradually substitutes CMOS transistor and has a wide application in the low-power-consumption devices.

Among TFETs, a vertical tunneling field-effect transistor (VTFET) has a tunable length of a vertical tunnel and a tunable width of the gate (for example, a change in the width of the gate could affect a saturating current through the vertical tunnel).

However, the performance of conventionally fabricated VTFET devices still needs to be improved. The disclosed devices and methods are directed to at least partially alleviate one or more problems set forth above and to solve other problems in the art.

SUMMARY

One aspect of the present disclosure provides a fabrication method of a vertical tunneling field effect transistor. The fabrication method includes: providing a semiconductor substrate; and forming a first doped layer on the semiconductor substrate. A plurality of vertical nanowires are formed on the first doped layer. Then dummy gate layers with top surfaces lower than top surfaces of the vertical nanowires, are formed on the first doped layer, and a first interlayer dielectric layer is formed on a top surface of the first doped layer exposed by dummy gate layers, and cover the top surfaces of the vertical nanowires. Grooves are formed in the first interlayer dielectric layer, by removing a portion of the first interlayer dielectric layer from the top surfaces of the vertical nanowires and removing a partial thickness of the vertical nanowires. After forming the grooves, a second doped layer is formed in each groove. Then openings are formed by etching the first interlayer dielectric layer between adjacent vertical nanowires, to expose the dummy gate layers. After forming the openings, the dummy gate layers are removed through the openings to form cavities, wherein each cavity includes the opening and a space provided by the removed dummy gate layers. A high-k gate dielectric layer is formed on sidewalls and a bottom of each cavity; and a gate electrode layer is formed on the high-k gate dielectric layer by filling each cavity with metals.

Another aspect of the present disclosure provides a vertical tunneling field effect transistor. The vertical tunneling field effect transistor includes: a semiconductor substrate; a first doped layer on the semiconductor substrate; vertical nanowires on the first doped layer; a second doped layer on a top of each vertical nanowire; an interlayer dielectric layer on the first doped layer, including a cavity between the adjacent vertical nanowires through the interlayer dielectric layer and exposing sidewalls of the adjacent vertical nanowires; a high-K gate dielectric layer in sidewalls and a bottom of each cavity; and a gate electrode layer on the high-K gate dielectric layer to fill each cavity.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

With the continuously decreasing critical dimensions in CMOS transistors, $SiO_2$ gate dielectric materials are substituted by high-k gate dielectric materials, to alleviate the problems of large leakage currents. Further, gates are made of metals, and correspondingly a Fermi level pinning effect and a boron penetrating effect between the high-k dielectric materials and the conventional gate materials is avoided. To further improve the performance of conventionally fabricated vertical tunneling field-effect transistor (VTFET) devices, a process to form the high-k gate dielectric layer has to be provided.

The present disclosure provides a VTFET device and fabricating method to at least partially alleviate above problems. An exemplary VTFET device may be formed by: forming cavities in an interlayer dielectric layer and forming a high-k gate dielectric layer in each cavity, to reduce the leakage current and improve the performance of the VTFET. The process for forming the high-k gate dielectric layer is easy for massive productions.

Figure 17:
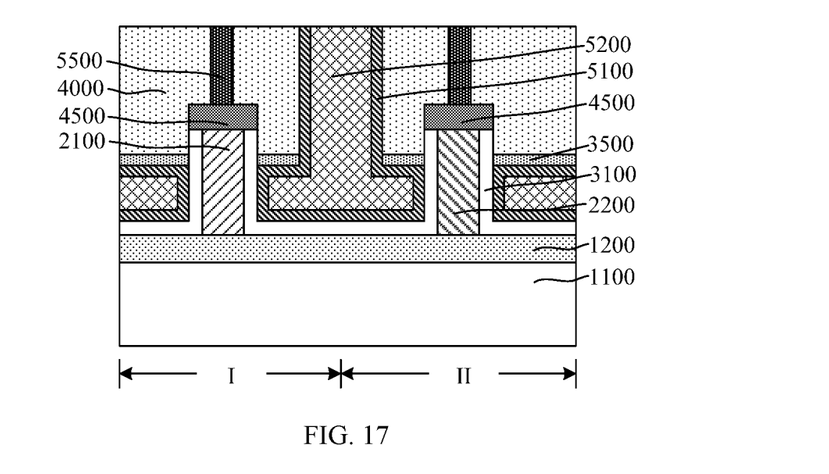
FIG. 17 illustrates an exemplary structure of a VTFET device according to various disclosed embodiments of the present disclosure.
Figure 18:
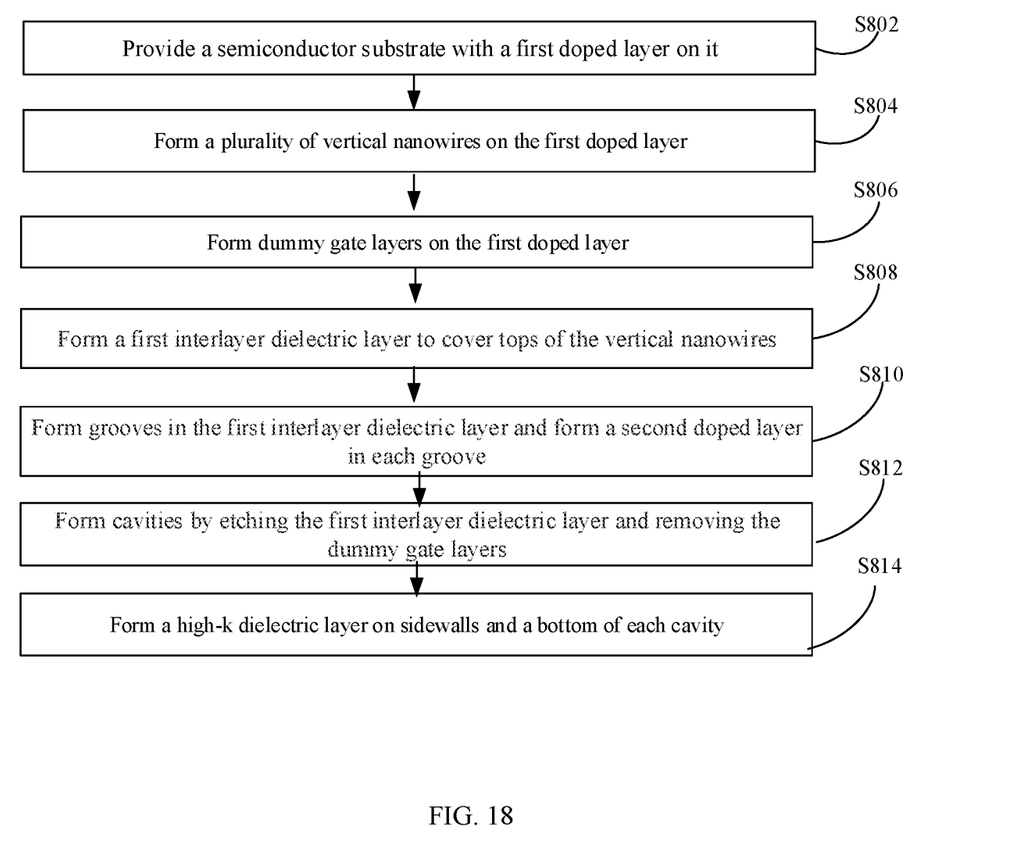
FIG. 18 illustrates an exemplary method for forming a VTFET device according to various disclosed embodiments of the present disclosure.

FIG. 1 to FIG. 16 illustrate semiconductor structures corresponding to certain stages for forming an exemplary VTFET device according to various disclosed embodiments of present disclosure. FIG. 17 illustrates an exemplary structure of a VTFET device formed by the methods according to various disclosed embodiments of present disclosure. FIG. 18 illustrates an exemplary method for forming a VTFET device according to various disclosed embodiments of the present disclosure.

Figure 1:
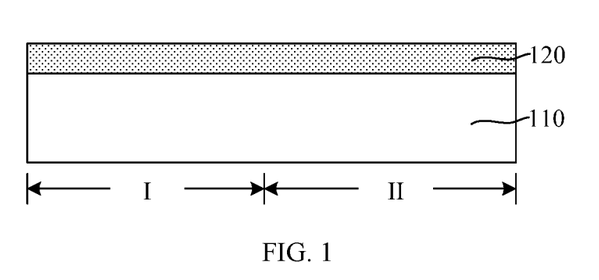
FIG. 1 to FIG. 16 illustrate semiconductor structures corresponding to certain stages for forming an exemplary vertical tunneling field-effect transistor (VTFET) device according to various disclosed embodiments of the present disclosure.

As illustrated in FIG. 1, a semiconductor substrate 110 may be provided (e.g., in Step S802 in FIG. 18). The semiconductor substrate 110 provides a platform to form a VTFET device.

In various embodiments, the semiconductor substrate may be made of a material including silicon, germanium, SiGe, SiC, GaAs, InGa, a silicon substrate on an insulator (SOI) and/or a germanium substrate on an insulator (GOI).

In some embodiments, the formed VTFET may be used to form a static random access memory (SRAM) device. Correspondingly, the semiconductor substrate 110 may include a PMOS region I and an NMOS region II adjacent to the PMOS region I. The PMOS region I may be used to form a pull-up transistor (PPU) and the NMOS region II may be used to form a pull-down transistor (NPU).

For illustration purposes, the present disclosure is primarily described by using the VTFET to form an SRAM device as an example, although any possible devices may be formed according to the disclosed methods and structures of the present disclosure.

Referring to FIG. 1, a first doped layer 120 may be formed on the semiconductor substrate 110.

A portion of the first doped layer 120 in the PMOS region I may be used as a source (or a drain) of the PPU, while a portion of the first doped layer 120 in the NMOS region II may be used as a drain (or a source) of the NPU.

For illustration purposes, the present disclosure is primarily described by an exemplary semiconductor structure having a portion of the first doped layer 120 in the PMOS region I as a drain of the PPU and a portion of the first doped layer 120 in the NMOS region II as a source of the NPU, which should not limit the scopes of the present disclosure.

The first doped layer 120 may cross the PMOS region I and the NMOS region II. Subsequently, the PMOS region I and the NMOS region II may be connected through a conductive plug, to realize a connection between the drain of the PPU and the source of the NPU. Correspondingly, a process for metallic connections in back-end-of-the-line (BEOL) may be simplified.

The first doped layer 120 may be used as a conducting wire. To reduce the resistance of the first doped layer 120, the first doped layer 120 may be a heavily doped layer and a concentration of doping ions in the first doped layer 120 may be sufficiently high to provide reduced resistance.

In various embodiments, the first doped layer 120 may be doped with N-type ions or P-type ions.

In one embodiment, the first doped layer may be formed by forming a first epitaxial layer on the semiconductor substrate 110 by an epitaxial process, and the first epitaxial layer may be in-situ doped with N-type ions in the process to form the first epitaxial layer. In one embodiment, the first epitaxial layer may be made of silicon and the first doped layer 120 may be a silicon layer doped with N-type ions.

In other embodiments, an ion implantation process may be applied on the first epitaxial layer after forming the first epitaxial layer, to form the first doped layer 120.

In one embodiment, the N-type ions in the first doped layer 120 may have a concentration of about $1E20$ atom/cm$^3$ to about $3E21$ atom/cm$^3$, which may be determined by needs of the actual process.

Figure 2:
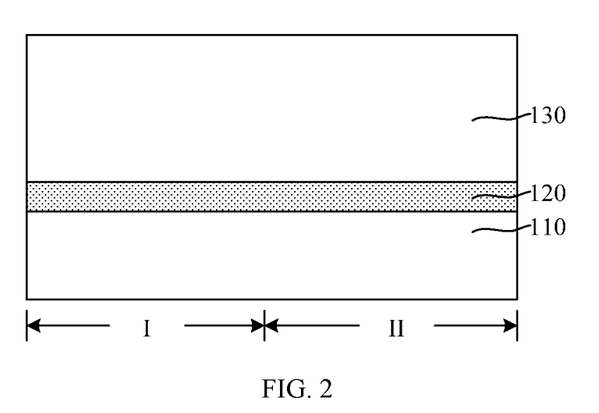
Figure 3:
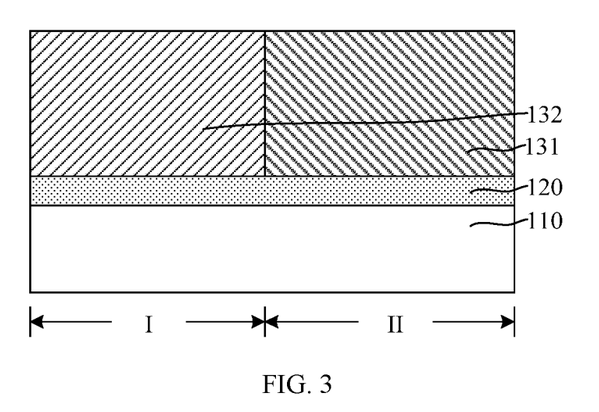
Figure 4:
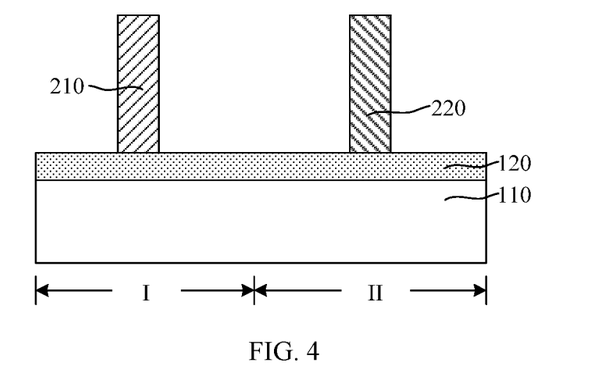

As illustrated in FIG. 2 to FIG. 4, a plurality of discrete vertical nanowires may be formed on the first doped layer 120 (e.g., in Step S804 in FIG. 18).

The vertical nanowires may be used as vertical channels of the formed VTFET device, and also may provide a platform to form a second doped layer subsequently.

Since the semiconductor substrate 110 may include PMOS region I and NMOS region II adjacent to each other, the vertical nanowires may also include first vertical nanowires 210 on the first doped layer 120 in the PMOS region I and second vertical nanowires 220 on the first doped layer 120 in the NMOS region II.

The doping type of the vertical nanowires may be determined by the type of the VTFET device. In one embodiment, the first vertical nanowires 210 may be doped with P-type ions and the second vertical nanowires 220 may be doped with N-type ions. The P-type ions may be ions of boron, gallium, indium, and/or any combination thereof. The N-type ions may be ions of phosphor, antimony, arsenic, and/or any combination thereof.

As illustrated in FIG. 2, a semiconductor layer 130 may be formed on the first doped layer 120.

The semiconductor layer 130 may be used to form the vertical nanowires by subsequent doping and patterning process.

In one embodiment, the semiconductor layer 130 may be formed by an epitaxial process.

The semiconductor layer 130 may be made of a material same as the semiconductor substrate 110 and the first doped layer 120, to enhance the compatibility of the process. In various embodiments, the semiconductor layer 130 may be made of a material including silicon, germanium, SiGe, SiC, GaAs and/or InGa.

As illustrated in FIG. 3, a plurality of well implantation process may be performed on the semiconductor layer 130 (shown in FIG. 2).

A first well implantation process may be performed on the semiconductor layer 130 in the PMOS region I, to form a P-type well region 132 in the semiconductor layer 130 in the PMOS region I. A second well implantation process may be performed on the semiconductor layer 130 in the NMOS region II, to form an N-type well region 131 in the semiconductor layer 130 in the NMOS region II.

As illustrated in FIG. 4, the semiconductor layer 130 may be patterned to form the vertical nanowires.

In one embodiment, multiple discrete vertical nanowires may be formed on the first doped layer 120. A number of the vertical nanowires may be equal to the number of the VTFETs and each vertical nanowire may correspond to one of the VTFETs formed subsequently.

FIG. 5 to FIG. 8 illustrates the processes for forming dummy gate layers 330 on the first doped layer 120 and the dummy gate layers 330 may have top surfaces lower than top surfaces of the vertical nanowires (e.g., in Step S806 in FIG. 18).

The dummy gate layers 330 may be used as sacrificial layers to occupy spaces for high-k gate dielectric layers and gate electrode layers. The dummy gate layers 330 may be removed in subsequent processes.

The dummy gate layers 330 may be made of a material which is easy to be removed since it will be removed later. The material of the dummy gate layers 330 may be different from the first doped layer 120 and the vertical nanowires, to reduce damages on the first doped layer 120 and the vertical nanowires in a subsequent process for removing the dummy gate layers 330.

In various embodiment, the dummy gate layers 330 may be made of a material including polysilicon, $SiO_xN_y$, SiC, SiCN, SiCNO, and/or amorphous carbon.

Figure 5:
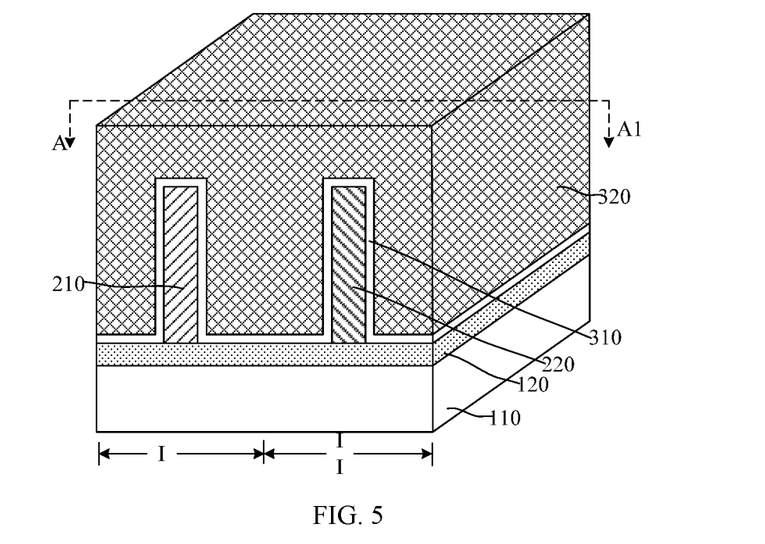
Figure 6:
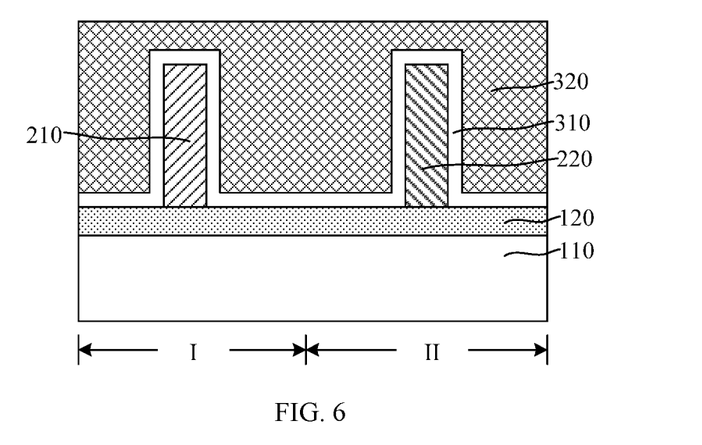

Referring to FIG. 5 and FIG. 6, a dummy gate film 320 may be formed on the first doped layer 120. FIG. 5 is a three-dimensional structure and FIG. 6 is a cross-sectional view of the structure along the A-A1 direction in FIG. 5. The dummy gate film 320 may cover the top surfaces of the vertical nanowires.

The dummy gate film 320 may provide a platform for forming the dummy gate layers 330 subsequently, and may cover the top surfaces of the first vertical nanowires 210 and the second vertical nanowires 220.

In one embodiment, the dummy gate film 320 may be made of polysilicon or other related materials.

Before forming the dummy gate film 320, a gate oxidation layer 310 may be formed to conformably cover the vertical nanowires and the first doped layer 120.

The gate oxidation layer 310 may protect the vertical nanowires and the first doped layer 120, to prevent the damages to the vertical nanowires and the first doped layer 120 in the process for removing the dummy gate layers 330.

In one embodiment, the gate oxidation layer 310 may be formed by a thermal oxidation process using a reaction gas including $O_2$. The reaction gas of the thermal oxidation process may react with the material of the first doped layer 120 and the material of the vertical nanowires to form the gate oxidation layer 310.

In one embodiment, the first doped layer 120 and the vertical nanowires may be formed by silicon, correspondingly the gate oxidation layer 310 may be made of $SiO_2$.

The dummy gate film 320 may be formed on the gate oxidation layer 310 after forming the gate oxidation layer 310.

Figure 7:
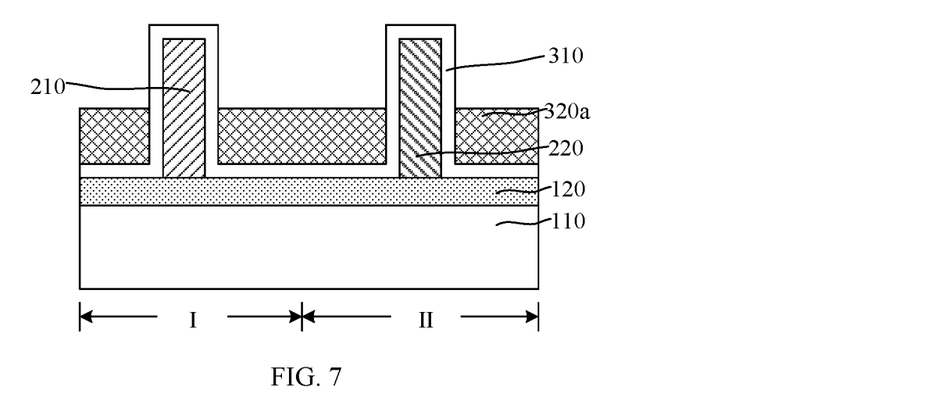

FIG. 7 is a cross-sectional view of the structure based on FIG. 6, a partial thickness of the dummy gate film 320 may be etched back and the remaining portion of dummy gate film may have a top surface lower than the top surfaces of the vertical nanowires.

The remaining dummy gate film 320a should have an appropriate thickness, and may determine a height of the high-K gate dielectric layer on sidewalls of each vertical nanowire. If the thickness of the remaining dummy gate film 320a is too small, the height of the high-k gate dielectric layer on the sidewalls of each vertical nanowire would be too small and the performance of the VTFET device would be poor. Subsequently, a partial thickness of each vertical nanowire may be removed to form a second doped layer. If the thickness of the remaining dummy gate film 320a is too large, it may be more difficult to form the second doped layer and the quality of the second doped layer may be poor. In one embodiment, the thickness of the remaining dummy gate film 320a may be about 10 nm to about 100 nm.

In one embodiment, a wet etching process may be used to etch back a partial thickness of the dummy gate film 320. The wet etching process may use an etch solution including tetramethylammonium hydroxide (TMAH) since the dummy gate film 320 may be made of polysilicon.

The detailed parameters of the wet etching process may be determined by the thickness of the dummy gate film 320 to be removed, or is determined by the initial thickness of the dummy gate film 320 and the thickness of the remaining dummy gate film 320a.

In other embodiments, a dry etching process or a combination of the dry etching process and wet etching process may be used to etch back a partial thickness of the dummy gate film 320.

Figure 8:
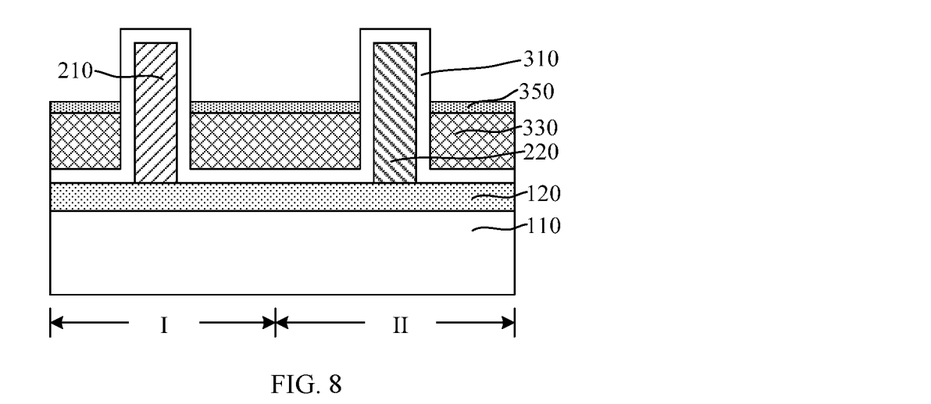

As illustrated in FIG. 8, an insulating layer 350 may be formed on the remaining dummy gate film 320a after removing a partial thickness of the dummy gate film 320.

Subsequently, a second doped layer may be formed on the top surface of each vertical nanowire, and a gate electrode layer may be formed in the space of each dummy gate layer 330. A conductive plug (CT) may be formed to electrically connect the second doped layer and the first doped layer 120. The insulating layers 350 may be used to electrically insulate the gate electrode layers from the CT.

In various embodiments, the insulating layer 350 may be made of a material including $SiN_x$ and/or $SiO_xN_y$.

As illustrated in FIG. 8, the remaining dummy gate film 320a may be patterned to form a plurality of discrete dummy gate layers 330 on the first doped layer 120. The plurality of discrete dummy gate layers 330 may be arranged along a direction perpendicular to a direction from the PMOS region I to the NMOS region II.

The space of each dummy gate layer 330 may be used to form the high-k dielectric layer and the gate electrode layer subsequently.

In one embodiment, a dry etching process may be used to pattern the remaining dummy gate film 320a, to form a plurality of discrete dummy gate layers 330.

The insulating layer 350 may be formed on the remaining dummy gate film 320a. The gate oxidation layer 310 may be formed between the remaining dummy gate film 320a and the first doped layer 120. Correspondingly, the insulating layer 350 and the gate oxidation layer 310 may be also patterned in the dry etching process to expose the first doped layer 120 between the adjacent dummy gate layers 330, for example, along a direction perpendicular to a direction from the PMOS region I to the NMOS region II.

In one embodiment, each dummy gate layer 330 may cross the PMOS region I and the NMOS region II. Correspondingly, after patterning, the multiple dummy gate layers 330 may be arranged along a direction perpendicular to a direction from the PMOS region I to the NMOS region II.

The dummy gate layers 330 may surround the first vertical nanowires 210 and the second vertical nanowires 220. For example, the projection of the first vertical nanowires 210 and the second vertical nanowires 220 on the semiconductor substrate 110 may be inside the projection of the dummy gate layers 330 on the semiconductor substrate 110.

Figure 9:
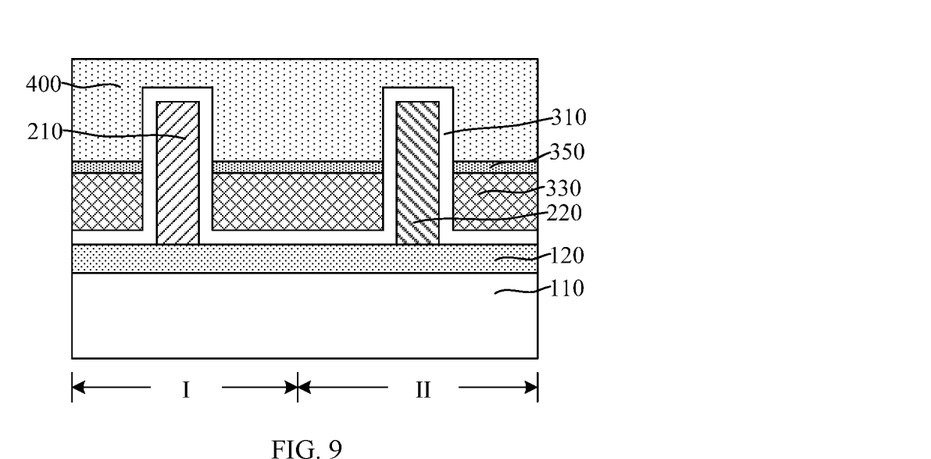

As illustrated in FIG. 9, a first interlayer dielectric layer 400 may be formed on the first doped layer 120 exposed by the dummy gate layers 330 to cover the top surfaces of the vertical nanowires (e.g., in Step S808 in FIG. 18).

The first interlayer dielectric layer 400 may be used to electrically insulate the adjacent semiconductor devices and to provide a platform for forming the CT subsequently.

The first interlayer dielectric layer 400 may be made of an insulating material, including $SiO_2$, $SiN_x$ and/or $SiO_xN_y$.

The first interlayer dielectric layer 400 may be formed by: forming a first dielectric film on the first doped layer 120 exposed by the dummy gate layers 330 to cover the top surface of the remaining gate oxidation layer 310; and planarizing the first dielectric film by a chemical mechanical polishing process to use the remaining first dielectric film as the first interlayer dielectric layer 400.

Figure 10:
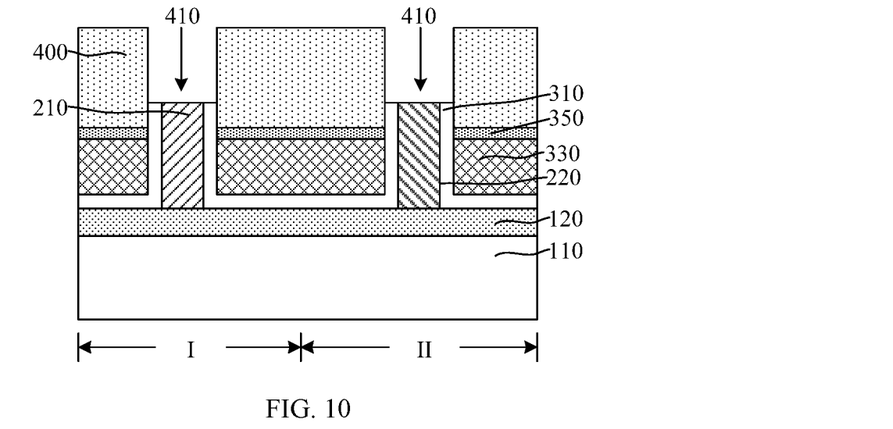

As illustrated in FIG. 10, a portion of the first interlayer dielectric layer 400 on the top of each vertical nanowire and a partial thickness of a corresponding vertical nanowire may be removed to form grooves 410 in the first interlayer dielectric layer 400 (in Step S810 in FIG. 18).

The groove 410 may provide positions to form second doped layers.

A portion of the first interlayer dielectric layer 400 on the top of each first vertical nanowire 210 and a partial thickness of the corresponding first vertical nanowire 210 may be removed by a dry etching process. A portion of the first interlayer dielectric layer 400 on the top of each second vertical nanowires 220 and a partial thickness of the corresponding second vertical nanowire 220 may be removed by the same dry etching process.

In the dry etching processes, a portion of the gate oxidation layer 310 on the top and sidewalls of each vertical nanowire may also be removed. After the dry etching process, the top surface of the remaining gate oxidation layer 310 on the sidewalls of each remaining vertical nanowire may be flush with the top of each remaining vertical nanowire.

Correspondingly, the grooves 410 may expose the tops of the first vertical nanowires 210, the tops of the second vertical nanowires 220, and the top of the remaining gate oxidation layer 310.

Figure 11:
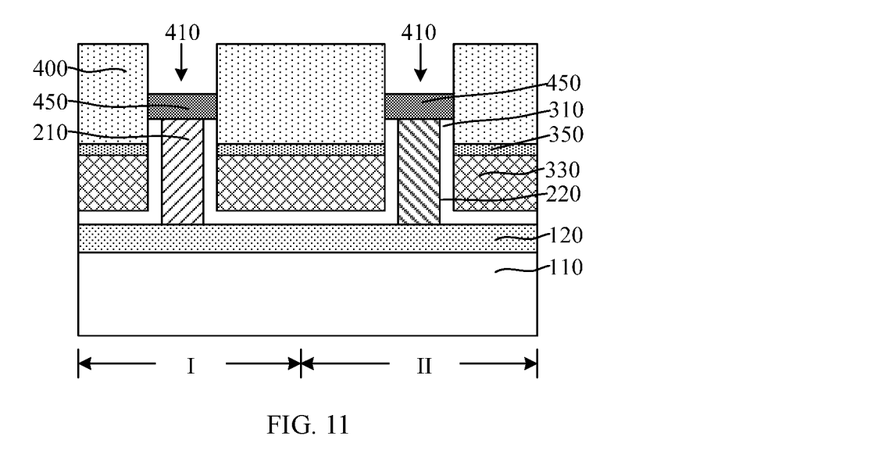

As illustrated in FIG. 11, a second doped layer 450 may be formed in each groove 410 (e.g., in Step S812 in FIG. 18).

Each second doped layer 450 in the PMOS region I may be used as a source (or a drain) of the pull-up transistor, while each second doped layer 450 in the NMOS region II may be used as a drain (or a source) of the pull-down transistor.

In one embodiment, the first doped layer 120 in the PMOS region I may be used as a drain of the pull-up transistor, while the first doped layer 120 in the NMOS region II may be used a source of the pull-down transistor. Correspondingly, each second doped layer 450 in the PMOS region I may be used as a source of the pull-up transistor, while each second doped layer 450 in the NMOS region II may be used as the drain of the pull-down transistor.

In one embodiment, the second doped layer 450 may be formed by: forming a second epitaxial layer in each groove 410 by an epitaxial process. Each second epitaxial layer may be in situ self-doped with ions when forming the second epitaxial layer.

In other embodiments, an ion implantation process may be performed on the second epitaxial layers after forming the second epitaxial layer, to form the second doped layer.

Doping ions in the second doped layer 450 may have a type same as, or different from, the type of the doping ions in the first doped layer 120. The type of the doping ions in the second doped layer 450 may be determined by the requirement of the actual process.

In one embodiment, the type of the doping ions in the second doped layer 450 may be different from the type of the doping ions in the first doped layer 120. Correspondingly, the type of the doping ions in the second doped layer 450 may be P-type.

In one embodiment, the second epitaxial layers may be made of silicon. Each second doped layer 450 in the PMOS region I and the NMOS region II may be a silicon layer doped with P-type ions. And the doped P-type ions may have a concentration of about 1E20 atom/cm$^3$ to about 4E21 atom/cm$^3$.

In other embodiments, the doping ions in each second doped layer 450 may be N-type.

In one embodiment, each second doped layers 450 may be formed inside each groove 410, and the top surface of each second doped layer 450 may be lower than the top of the grooves 410.

Figure 12:
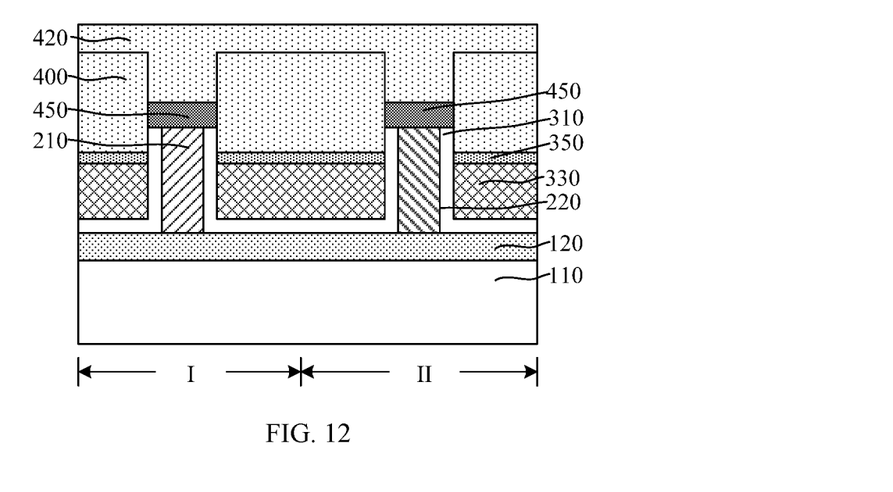

As illustrated in FIG. 12, a second interlayer dielectric layer 420 may be formed to fill the grooves 410 after forming the second doped layer 450.

The second interlayer dielectric layer 420 may be used to cover the second doped layer 450 and to provide a platform to form the CT connecting the second doped layers 450.

The second interlayer dielectric layer 420 may be made of an insulating material. In one embodiment, the second interlayer dielectric layer 420 may be made of a material same as the first interlayer dielectric layer 400, including for example, $SiO_2$, to improve the compatibility and reduce the difficulty of the fabrication process. In other embodiments, the second interlayer dielectric layer 420 may be made of $SiN_x$ and/or $SiO_xN_y$.

The second interlayer dielectric layer 420 may be formed by: filling the grooves 410 with a second dielectric film and planarizing the second dielectric film by the chemical mechanical planarizing process to use the remaining second dielectric film as the second interlayer dielectric layer 420.

In one embodiment, the second interlayer dielectric layer 420 may cover the top of the first interlayer dielectric layer 400, to reduce the difficulty of the fabrication process. In other embodiments, the second interlayer dielectric layer 420 may have a top surface flush with the top surface of the first interlayer dielectric layer 400.

Figure 13:
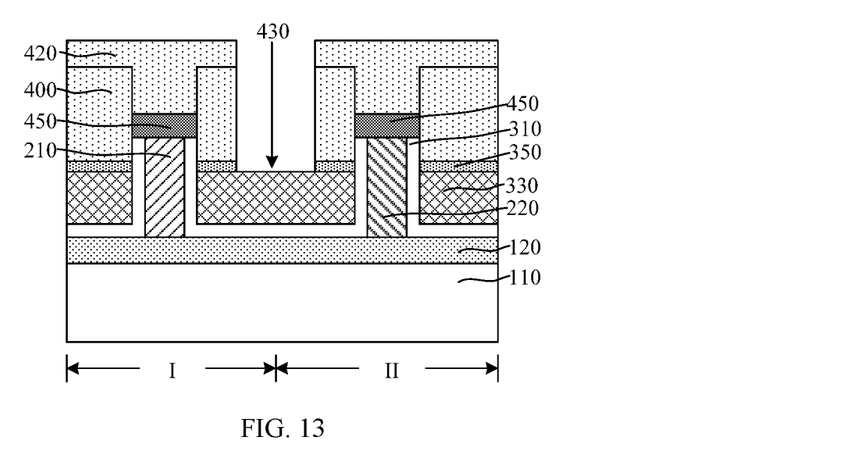

As illustrated in FIG. 13, the first interlayer dielectric layer 400 between the adjacent vertical nanowires may be etched to form openings 430 after forming the second doped layer 450. The openings 430 may expose the dummy gate layers 330 (e.g., in Step S814 in FIG. 18).

The openings 430 may provide a foundation to remove the dummy gate layers 330 subsequently.

In one embodiment, a dry etching process may be used to etch the first interlayer dielectric layer 400 to effectively control shapes of the openings 430.

The openings 430 may be formed in the first interlayer dielectric layer 400 between the first vertical nanowires 210 and the second vertical nanowires 220.

Since the second interlayer dielectric layer 420 may cover the top surface of the first interlayer dielectric layer 400, the process for forming the openings 430 may further include etching the second interlayer dielectric layer 420, and the openings 430 may penetrate the second interlayer dielectric layer 420 and the first interlayer dielectric layer 400 between the first vertical nanowires 210 and the second vertical nanowires 220.

Figure 14:
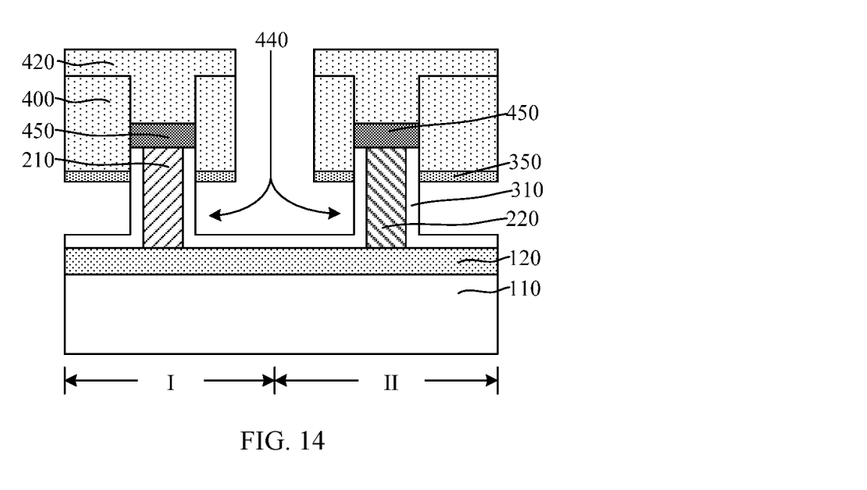

As illustrated in FIG. 14, the dummy gate layers 330 may be removed after forming the openings 430. The openings 430 and the spaces corresponding to the removed dummy gate layers 330 may form cavities 440 (in Step S814 in FIG. 18).

Each cavity 440 may provide a space for forming the high-k dielectric layer and the gate electrode layer.

In one embodiment, not only a portion of the dummy gate layers 330 exposed by the openings 430, but also a portion of the dummy gate layers 330 covered by the first interlayer dielectric layer 400, may be removed in the process for removing the dummy gate layers 330. A wet etching process may be used to remove the dummy gate layers 330 since the dummy gate layers 330 may be hollowed out because of the isotropic etching characteristics of the wet etching process.

Since the dummy gate layers 330 may cross the PMOS region I and the NMOS region II, and the dummy gate layers 330 may also surround the first vertical nanowires 210 and the second nanowire 220, all of the dummy gate layers 330 can be removed by the etching process through the opening 430.

In one embodiment, the dummy gate layers 330 may be made of polysilicon. Correspondingly, the wet etching process may use an etching solution of tetramethylammonium hydroxide (TMAH).

Figure 15:
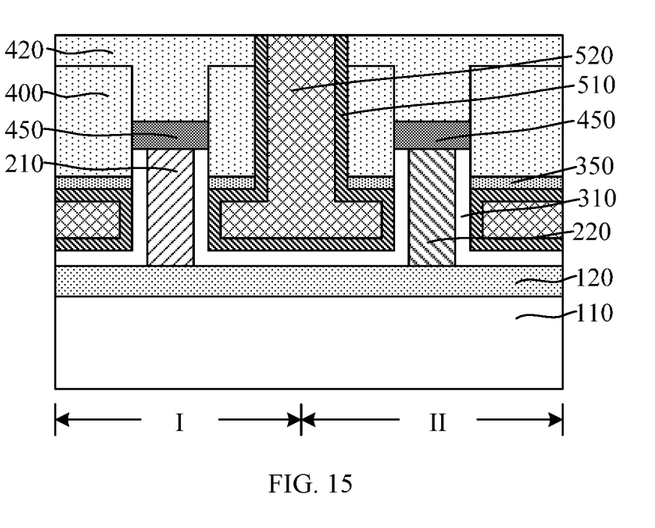

As illustrated in FIG. 15, the high-k gate dielectric layer 510 may be formed on the sidewalls and a bottom of each cavity 440 (in Step S814 in FIG. 18).

Substitution of the conventional $SiO_2$ gate dielectric material by the material of the high-k gate dielectric layer 510, may alleviate the leakage current problem induced by the continuous decrease of the critical dimensions of the VTFET device.

The high-k gate dielectric layer 510 may be made of a material whose relative dielectric constant is higher than $SiO_2$. In various embodiments, the high-k gate dielectric layer 510 may be made of a material including $HfO_2$, HfSiO, HfSiON, HfTaO, HfSiO, HfZrO, $ZrO_2$ and/or $Al_2O_3$.

In one embodiment, the high-k gate dielectric layer 510 may be formed by an atomic layer deposition process and also may be formed on the top of the second interlayer dielectric layer 420.

In other embodiments, the high-k gate dielectric layer 510 may be formed by a chemical vapor deposition process.

The cavities 440 may penetrate the second interlayer dielectric layer 420 and the first interlayer dielectric layer 400, so the high-k gate dielectric layer 510 may be also formed on the sidewalls of the openings 430 between the second interlayer dielectric layer 420 and the first interlayer dielectric layer 400. The length of the high-k gate dielectric layer 510 in the present disclosure may be increased compared to the method where the high-k gate dielectric layer 510 is only formed on the dummy gate layers 330, and the short channel effect may be avoided or eliminated.

FIG. 15 also illustrates that each cavity 440 may be filled with metals to form a gate electrode layers 520 on the high-k gate dielectric layer 510.

After introducing the high-k gate dielectric layer 510, the gate electrode layer 520 may be made of metals for example, and the Fermi level pinning effect between the high-k dielectric materials and the conventional gate materials (such as polysilicon) and the boron penetration effect may be alleviated.

In various embodiments, the gate electrode layer 520 may be made of a metal including W, Al, Cu, Ag, Au, Pt, Ni and/or Ti.

After filling each cavity 440 with a metal, the metal may also cover the top surface of the high-k gate dielectric layer 510. A portion of the metal higher than the top surface of the second interlayer dielectric layer 420 may be removed by a planarizing process and a portion of the high-k gate dielectric layer 510 higher than the top surface of the second interlayer dielectric layer 420 may also be removed. Subsequently, the remaining metal in each cavity 440 may be used as the gate electrode layer 520.

In one embodiment, the planarizing process may be a chemical mechanical polishing process.

Figure 16:
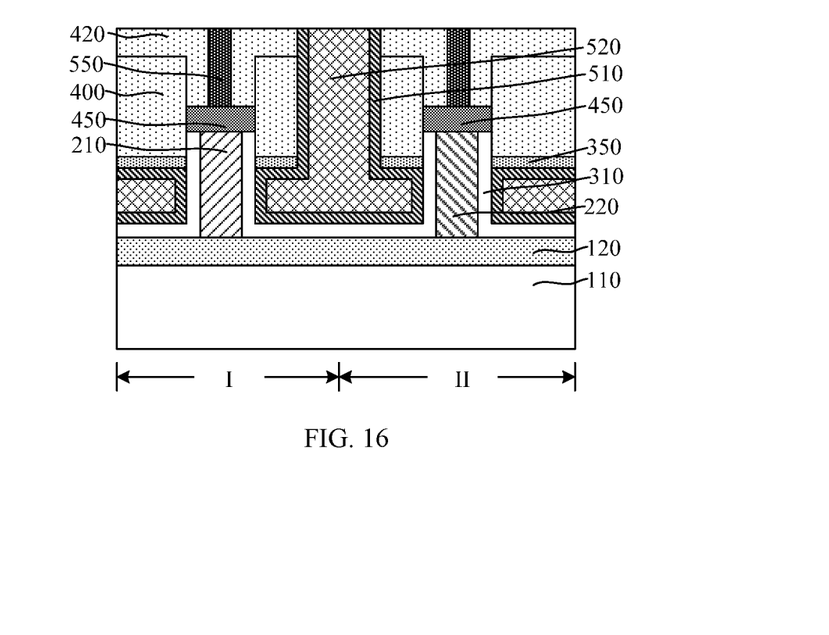

As illustrated in FIG. 16, the processes after forming the gate electrode layers 520 may include: forming first conductive plugs (CT) 550 electrically connected to the second doped layer 450 in the second interlayer dielectric layer 420 above the second doped layer 450; and forming second conductive plugs (not shown in FIG. 16) electrically connected to the first doped layer 120 in the second interlayer dielectric layer 420 and the first interlayer dielectric layer 410 between the gate electrode layers 520.

The first conductive plugs 550 and the second conductive plugs may be used as electrical connections in one semiconductor device and electrical connections between different devices. The second conductive plugs may be used to electrically connect the pull-up and the pull-down transistors. In various embodiments, the first conductive plugs 550 and the second conductive plugs may be made of a metal including W Al, Cu, Ag, and/or Au.

The first conductive plugs 550 and the second conductive plugs may be formed by: etching the second interlayer dielectric layer 420 on each second doped layers 450 to form a first contact opening exposing the corresponding second doped layer 450 in the second interlayer dielectric layer 420; etching the second interlayer dielectric layer 420 and the first interlayer dielectric layer 410 between the gate electrode layers 520 to form second contact openings which penetrating the second interlayer dielectric layer 420 and the first interlayer dielectric layer 410 to expose the second doped layers 120; filling the first contact openings and the second contact openings with conductive materials which may further cover the top surface of the second interlayer dielectric layer 420; removing a portion of the conductive materials above the top surface of the second interlayer dielectric layer 420 by a chemical mechanical polishing process. Correspondingly, the remaining conductive materials in the first contact openings may be used as the first conductive plugs 550, while the remaining conductive materials in the second contact openings may be used as the second conductive plugs.

Various embodiments also provide a VTFET device as shown in FIG. 17. In one embodiment, the VTFET device may include: a semiconductor substrate 1100; a first doped layer 1200 on the semiconductor substrate 1100; vertical nanowires 2100 on the first doped layer 1200; a second doped layer 4500 on a top surface of each vertical nanowire; an interlayer dielectric layer 4000 on the first doped layer 1200; cavities in the interlayer dielectric layer 4000 penetrating the interlayer dielectric layer 4000 and exposing the sidewalls of the vertical nanowires; a high-k gate dielectric layer 5100 on a bottom and the sidewalls of each cavity; and a gate electrode layer 5200 on each high-k gate dielectric layer 5100 to fill each cavity.

The semiconductor substrate 1100 may provide a platform to form the VTFET device.

In various embodiments, the semiconductor substrate 1100 may be made of a material including silicon, germanium, SiGe, SiC, GaAs and/or InGa. The semiconductor substrate 1100 also may be a silicon substrate on an insulator or a germanium substrate on an insulator.

In one embodiment, the formed VTFETs may be used to form a static random access memory (SRAM) device, and the semiconductor substrate 1100 may include a PMOS region I and an NMOS region II adjacent to the PMOS region I. The PMOS region I may be used to form a pull-up transistor (PPU), and the NMOS region II may be used to form a pull-down transistor (NPU)

The first doped layer 1200 in the PMOS region I may be used as a source (or a drain) of the PPU, while the first doped layer 1200 in the NMOS region II may be used as a drain (or a source) of the NPU.

In one embodiment, the first doped layer 1200 in the PMOS region I can be used as the drain of the PPU, while the first doped layer 1200 in the NMOS region II can be used the source of the NPU.

The first doped layer 1200 may cross the PMOS region I and the NMOS region II. Subsequently, the PMOS region I and the NMOS region II may be connected through a conductive plug, to realize the connection between the drain of the PPU and the source of the NPU. Correspondingly, the processes of metallic connections in BEOL may be simplified.

The first doped layer 1200 may function as a conducting wire. To reduce the resistance, the first doped layer 1200 may be a heavily doped layer and doping ions in the first doped layer 1200 may have a high concentration.

In one embodiment, the first doped layer 1200 may be doped with N-type ions. In other embodiments, the first doped layer 1200 may be doped with P-type ions.

In one embodiment, the first doped layer 1200 may be a silicon layer doped with N-type ions and the concentration of the doping N-type ions in the first doped layer 1200 may be 1E20 atom/cm$^3$ to 3E21 atom/cm$^3$. The concentration of the doping N-type ions in the first doped layer 1200 may be determined by the requirement of the actual process.

The vertical nanowires may be used as vertical channels of the VTFET device, and also may provide a platform for forming the second doped layers 4500 subsequently.

Since the semiconductor substrate 1100 may include the PMOS region I and the NMOS region II adjacent to each other, the vertical nanowires may also include first vertical nanowires 2100 on the first doped layer 1200 in the PMOS region I and second vertical nanowires 2200 on the first doped layer 1200 in the NMOS region II.

The doping type of the vertical nanowires may be determined by the type of the VTFET device. In one embodiment, the first vertical nanowires 2100 may be doped with P-type ions and the second vertical nanowires 2200 may be doped with N-type ions. The P-type ions may be ions of boron, gallium, Indium, and/or any combination thereof. The N-type ions may be ions of phosphor, antimony, arsenic, and/or any combination thereof.

A portion of the second doped layer 4500 in the PMOS region I may be used as a source (or a drain) of the pull-up transistor, while a portion of the second doped layer 4500 in the NMOS region II may be used as a drain (or a source) of the pull-down transistor.

In one embodiment, a portion of the first doped layer 1200 in the PMOS region I may be used as the drain of the pull-up transistor, while a portion of the first doped layer 1200 in the NMOS region II may be used the source of the pull-down transistor. Correspondingly, a portion of the second doped layer 4500 in the PMOS region I may be used as the source of the pull-up transistor, while a portion of the second doped layer 4500 in the NMOS region II may be used as the drain of the pull-down transistor.

The type of the doping ions in the second doped layers 4500 may be as same as, or be different from, the type of the doping ions in the first doped layer 1200. The type of the doping ions in the second doped layers 4500 may be determined by the requirement of the actual process.

In one embodiment, the type of the doping ions in the second doped layers 4500 may be different from, the type of the doping ions in the first doped layer 1200. Correspondingly, the type of the doping ions in the second doped layers 4500 may be P-type.

In embodiment, the second doped layers 4500 in the PMOS region I and the NMOS region II may be silicon layers doped with P-type ions. And the concentration of the doped P-type ions may be 1E20 atom/cm$^3$ to 4E21 atom/cm$^3$.

In other embodiments, the type of the doping ions in the second doped layers 450 may be N-type.

The interlayer dielectric layer 4000 may be used to electrically insulate the adjacent semiconductor devices and to provide a platform for forming the high-k gate dielectric layer 5100 and the gate electrode layers 5200 subsequently. The interlayer dielectric layer 4000 may be formed on the first doped layer 1200 and cover the top of the second doped layers 4500.

The interlayer dielectric layer 4000 may be made of an insulating material. In various embodiments, the first interlayer dielectric layer 4000 may be made of an insulating material including $SiO_2$, $SiN_x$ and/or $SiO_xN_y$.

There may be cavities in the interlayer dielectric layer 4000 between the vertical nanowires. The cavities may penetrate the interlayer dielectric layer 4000 and expose the sidewalls of the vertical nanowires. Correspondingly, a part of the interlayer dielectric layer may be in a suspended state, and each cavity may be used to accommodate the high-k gate dielectric layer 5100 and the gate electrode layer 5200.

Substitution of the conventional $SiO_2$ gate dielectric material by the material of the high-k gate dielectric layer 5100, may overcome the leakage current problem induced by the continuous decrease of the critical dimensions of the VTFET device.

The high-k gate dielectric layer 5100 may be made of a material whose relative dielectric constant is higher than $SiO_2$. In various embodiments, the high-k gate dielectric layer 510 may be made of a material including $HfO_2$, HfSiO, HfSiON, HfTaO, HfTiO, HfZrO, $ZrO_2$ and/or $Al_2O_3$.

The high-k gate dielectric layer 5100 may be also formed in the interlayer dielectric layer 4000. The length of the high-k gate dielectric layer 5100 in the present disclosure may be increased compared to the method where the high-k gate dielectric layer 5100 only are formed on the bottom and the sidewalls of the cavities, and the short channel effect may be improved.

After introducing the high-k gate dielectric layer 5100, the gate electrode layers 5200 may be made of metals for example, and the Fermi level pinning effect between the high-k dielectric materials and the conventional gate materials (such as polysilicon) and the boron penetration effect may be prevented.

In various embodiments, the gate electrode layer 5200 may be made of a metal including W, Al, Cu, Ag, Au, Pt, Ni and/or Ti.

In various embodiments, according to the requirement of the real processes, the VTFET device may further include a gate oxidation layer 3100 on the sidewalls of the vertical nanowires and on the top surface of the first doped layer 1200.

The gate oxidation layer 3100 may be used to prevent the first doped layer 1200 and the vertical nanowires from damage when forming the cavities. In one embodiment, the gate oxidation layer 3100 may be made of $SiO_2$.

The VTFET device may further include: first conductive plugs 5500 electrically connected to the second doped layer 4500 in the interlayer dielectric layer 4000 above the second doped layer 4500; and second conductive plugs (not shown in the figures) electrically connected to the first doped layer 1200 in the interlayer dielectric layer 4000 between the gate electrode layers 5200.

The first conductive plugs 5500 and the second conductive plugs may be used as electrical connections in one semiconductor devices and between different devices. The second conductive plugs may be used to electrically connect the pull-up and the pull-down transistors.

In one embodiment, the first conductive plugs 5500 and the second conductive plugs may be made of W. In other embodiments, the first conductive plugs 5500 and the second conductive plugs may be made of a metallic material including Al, Cu, Ag, and/or Au.

The VTFET device may further include an insulating layer 3500 between the bottom of the interlayer dielectric layer 4000 and the high-k gate dielectric layer 5100.

The insulating layer 3500 may be used to electrically insulate the gate electrode layers 5200 from the first conductive plugs 5500, and also insulate the gate electrode layers 5200 from the second conductive plugs. Correspondingly, the electrical connection between the gate electrode layers 5200 and the first conductive plugs 5500 or the second conductive plugs may be prevented.

In various embodiment, the insulating layer 3500 may be made of a material including $SiN_x$ and/or $Si_xN_y$.

In the various embodiments of the present disclosure, the dummy gate layers may occupy spaces, and the openings in the first interlayer dielectric layer and the spaces of the dummy gate layers may form cavities. Then the high-k gate dielectric layer may be formed in each cavity to reduce the leakage current of the VTFET device and improve the performance of the VTFET device. The process to form the high-k gate dielectric layer is easy and is appropriate for massive production.

Further, the high-k gate dielectric layer may be also formed on the sidewalls of each opening in the first interlayer dielectric layer. In comparison to the method where the high-k gate dielectric layer is only formed on a bottom and sidewalls of the space of each dummy gate layer, a length of the high-k dielectric layer may be increased and the short channel effect may be avoided or eliminated.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A vertical tunneling field effect transistor (VTFET) device, comprising:
   a semiconductor substrate;
   a first doped layer on the semiconductor substrate;
   a plurality of vertical nanowires on the first doped layer;
   a gate oxidation layer formed on sidewalls of each vertical nanowires and the first doped layer;
   a second doped layer on a top surface of each of the plurality of vertical nanowires;
   a first interlayer dielectric layer on the first doped layer, wherein the first interlayer dielectric layer contains a cavity between the adjacent vertical nanowires through the first interlayer dielectric layer and exposing the gate oxidation layer on the first doped layer and the sidewalls of the adjacent vertical nanowires;
   a high-K gate dielectric layer formed on and completely covering inner walls of each cavity; and
   a gate electrode layer on the high-K gate dielectric layer to fill each cavity.

2. The device according to claim 1, wherein:
   the semiconductor substrate includes a PMOS region and an NMOS region adjacent to each other.

3. The device according to claim 2, wherein:
   a portion of the first doped layer in the PMOS region is used as a drain of the pull-up transistor, while a portion of the first doped layer in the NMOS region is used a source of the pull-down transistor; and
   a portion of the second doped layer in the PMOS region is used as a source of the pull-up transistor, while a portion of the second doped layer in the NMOS region may be used as a drain of the pull-down transistor.

4. The device according to claim 1, further including an insulating layer between a bottom of the first interlayer dielectric layer and the high-K gate dielectric layer.

5. The device according to claim 4, wherein the insulating layer is made of $SiN_x$, $SiO_xN_y$, or a combination thereof.

6. The device according to claim 4, wherein the first interlayer dielectric layer covers the second doped layer.

7. The device according to claim 6, further including:
   a second interlayer dielectric layer on the first interlayer dielectric layer and the second doped layer;
   first conducting plugs in the second interlayer dielectric layer on the second doped layer, wherein the first conducting plugs electrically connect to the second doped layer; and
   second conducting plugs in the first interlayer dielectric layer and the second interlayer dielectric layer between the gate electrode layers, wherein the second conducting plugs electrically connect to the first doped layer.

8. The device according to claim 1, wherein the high-k gate dielectric layer is made of $HfO_2$, HfSiO, HfSiON, HfTaO, HfTiO, HfZrO, $ZrO_2$, $Al_2O_3$, or a combination thereof.

9. The device according to claim 1, wherein the gate oxidation layer isolates the high-K gate dielectric layer from the doped layer and the plurality of vertical nanowires.

10. The device according to claim 1, wherein:
    a top surface of the second doped layer is lower than a top surface of the first interlayer dielectric layer, and
    a bottom surface of the second doped layer is coplanar with the top surface of each of the plurality of vertical nanowires.

11. A vertical tunneling field effect transistor (VTFET) device, comprising:
    a semiconductor substrate;
    a first doped layer on the semiconductor substrate;
    a plurality of vertical nanowires on the first doped layer;
    a gate oxidation layer formed on sidewalls of each vertical nanowires and the first doped layer;
    a second doped layer on a top surface of each of the plurality of vertical nanowires;
    a first interlayer dielectric layer on the first doped layer, wherein the first interlayer dielectric layer contains a cavity between the adjacent vertical nanowires through the first interlayer dielectric layer and exposing the gate oxidation layer on the sidewalls of the adjacent vertical nanowires;
    a high-K gate dielectric layer formed on and completely covering inner walls of each cavity; and
    a gate electrode layer on the high-K gate dielectric layer to fill each cavity, wherein a type of doped ions in the second doped layer is different from a type of doped ions in the first doped layer.

12. The device according to claim 11, wherein:
    the semiconductor substrate includes a PMOS region and an NMOS region adjacent to each other.

13. The device according to claim 12, wherein:
    a portion of the first doped layer in the PMOS region is used as a drain of the pull-up transistor, while a portion of the first doped layer in the NMOS region is used a source of the pull-down transistor; and a portion of the second doped layer in the PMOS region is used as a source of the pull-up transistor, while a portion of the second doped layer in the NMOS region may be used as a drain of the pull-down transistor.

14. The device according to claim 11, further including an insulating layer between a bottom of the first interlayer dielectric layer and the high-K gate dielectric layer.

15. The device according to claim 14, wherein the insulating layer is made of $SiN_x$, $SiO_xN_y$, or a combination thereof.

16. The device according to claim 14, wherein the first interlayer dielectric layer covers the second doped layer.

17. The device according to claim 16, further including:
a second interlayer dielectric layer on the first interlayer dielectric layer and the second doped layer;
first conducting plugs in the second interlayer dielectric layer on the second doped layer, wherein the first conducting plugs electrically connect to the second doped layer; and
second conducting plugs in the first interlayer dielectric layer and the second interlayer dielectric layer between the gate electrode layers, wherein the second conducting plugs electrically connect to the first doped layer.

18. The device according to claim 11, wherein the high-k gate dielectric layer is made of $HfO_2$, HfSiO, HfSiON, HfTaO, HfTiO, HfZrO, $ZrO_2$, $Al_2O_3$, or a combination thereof.

19. The device according to claim 11, wherein the gate oxidation layer isolates the high-K gate dielectric layer from the doped layer and the plurality of vertical nanowires.

* * * * *